(12) United States Patent
Chen et al.

(10) Patent No.: US 10,290,736 B2
(45) Date of Patent: May 14, 2019

(54) SEMICONDUCTOR DEVICE AND METHOD OF FORMING THE SAME

(71) Applicants: UNITED MICROELECTRONICS CORP., Hsin-Chu (TW); Fujian Jinhua Integrated Circuit Co., Ltd., Quanzhou, Fujian Province (CN)

(72) Inventors: Kai-Ping Chen, Tainan (TW); Li-Wei Feng, Kaohsiung (TW); Kuei-Hsuan Yu, New Taipei (TW); Chiu-Hsien Yeh, Tainan (TW)

(73) Assignees: UNITED MICROELECTRONICS CORP., Hsin-Chu (TW); Fujian Jinhua Integrated Circuit Co., Ltd., Quanzhou, Fujian Province (CN)

( * ) Notice: Subject to any disclaimer, the term of this patent is extended or adjusted under 35 U.S.C. 154(b) by 0 days.

(21) Appl. No.: 15/872,996

(22) Filed: Jan. 17, 2018

(65) Prior Publication Data
US 2018/0212055 A1    Jul. 26, 2018

(30) Foreign Application Priority Data
Jan. 23, 2017    (CN) .......................... 2017 1 0058125

(51) Int. Cl.
*H01L 29/78*        (2006.01)
*H01L 29/423*    (2006.01)
*H01L 27/108*    (2006.01)

(52) U.S. Cl.
CPC .... *H01L 29/7827* (2013.01); *H01L 27/10823* (2013.01); *H01L 27/10876* (2013.01); *H01L 27/10888* (2013.01); *H01L 27/10891* (2013.01); *H01L 29/4236* (2013.01)

(58) Field of Classification Search
CPC ........... H01L 29/7827; H01L 27/10823; H01L 27/10891; H01L 29/4236; H01L 27/10888; H01L 27/10876
See application file for complete search history.

(56) References Cited

U.S. PATENT DOCUMENTS

| 5,970,359 | A | * | 10/1999 | Wang | ...................... | H01L 28/91 |
| | | | | | | 257/E21.019 |
| 6,274,437 | B1 | * | 8/2001 | Evans | ............... | H01L 21/26586 |
| | | | | | | 438/272 |
| 6,583,010 | B2 | * | 6/2003 | Mo | ...................... | H01L 29/7813 |
| | | | | | | 438/270 |

(Continued)

OTHER PUBLICATIONS

Lin, Title of Invention: Method for Fabricating Semiconductor Device, U.S. Appl. No. 15/465,622, filed Mar. 22, 2017.

*Primary Examiner* — Karen Kusumakar
(74) *Attorney, Agent, or Firm* — Winston Hsu

(57) ABSTRACT

A semiconductor device and a method of forming the same are provided. A substrate is provided. A trench is formed in the substrate and a conductive material is formed filling the trench. A portion of the conductive material filling an upper portion of the trench is removed to expose an upper surface of the substrate and an upper corner and an upper sidewall of the trench. A doping process is performed to form a doped region in the substrate along the exposed upper surface of the substrate and the exposed upper corner and upper sidewall of the trench. The doped region has an upside-down L shape.

20 Claims, 5 Drawing Sheets

(56) References Cited

U.S. PATENT DOCUMENTS

| | | | |
|---|---|---|---|
| 6,919,248 B2* | 7/2005 | Francis | H01L 29/0839 |
| | | | 438/270 |
| 2013/0240985 A1* | 9/2013 | Hirler | H01L 29/0878 |
| | | | 257/330 |
| 2015/0069482 A1 | 3/2015 | Mueller | |
| 2015/0214220 A1* | 7/2015 | Seo | H01L 27/088 |
| | | | 257/392 |

* cited by examiner

SEMICONDUCTOR DEVICE AND METHOD OF FORMING THE SAME

BACKGROUND OF THE INVENTION

1. Field of the Invention

The present invention generally relates to a semiconductor device and a method of forming the same, and more particularly, to a trench-type gate of a dynamic random access memory (DRAM) and a method of forming the same.

2. Description of the Prior Art

A dynamic random access memory (DRAM) is one kind of volatile memory. A DRAM usually includes an array region including a plurality of memory cells and a peripheral region including control circuits. Typically, a memory cell includes one transistor and one capacitor electrically coupled to the transistor, which is known as a 1T1C cell. A digital data is stored in a memory cell by controlling the transistor to charge or discharge the capacitor. The control circuits in the peripheral region may address each of the memory cells in the array region by plural columns of word lines and plural rows of bit lines traversing the array region and electrically connected to each of the memory cells to perform reading, writing or erasing data.

In advanced technology node of semiconductor manufacturing, the dimension of a memory cell has been miniaturized for higher integrity by adopting three-dimensional structure. DRAMs having buried word line structures have been proposed and widely used in the field in which gate electrodes of transistors and word lines for controlling the transistors are formed integrally in a plurality of trenches formed in the substrate and traversing through the active regions. The transistors are trench-type gates formed at the overlapping region between the active regions and the trenches. The advantages of using buried word line structures may include improved speed and higher integrity. The leakage current resulting from the short channel effect as device shrinking may be avoided.

However, there are still some problems need to be overcome when adopting buried word line structure. For example, drain induced gate leakage (GIDL) is a serious problem for DRAMs having buried word line structures. GIDL is caused by overlapping between the source/drain region and the gate electrode of the transistor. In conventional planar gates, GIDL may be prevented by forming lightly doped drain (LDD) regions and spacers to increase the distance between the source/drain regions and the gate electrode thereby avoiding the overlapping between the source/drain regions and the gate electrode. As for a trench-type gate, the GIDL problem becomes more serious because that the source/drain regions are formed adjacent to the opening of the trench by implanting ions into the substrate. The ions in the source/drain regions tend to diffuse toward a deeper region in the substrate, resulting in overlapping with the gate electrode and serious GIDL problem. Therefore, there is still a need in the field to provide a trench-type gate having reduced GIDL and better performance.

SUMMARY OF THE INVENTION

One aspect of the present invention is to provide a method of forming a semiconductor device. First, a substrate having an upper surface is provided. At least a trench is formed in the substrate. A conductive material is formed to fill up the trench. A portion of the conductive material is removed until a top surface of the conductive material is below the upper surface of the substrate thereby exposing the upper surface of the substrate and a top corner and an upper sidewall of the trench. A doping process is then performed to form a doped region in the substrate along the exposed upper surface of the substrate, the top corner and the upper sidewall of the trench and having an upside-down L shape, wherein the doping process is preferably a plasma doping (PLAD) process.

Another aspect of the present invention is to provide a semiconductor device including a substrate having an upper surface. At least a trench is formed in the substrate. A conductive material is formed partially filling the trench and has a top surface lower than the upper surface of the substrate thereby exposing the upper surface of the substrate, a top corner and an upper sidewall of the trench. A doped region having an upside-down L shape is formed in the substrate at the top corner of the trench and having an horizontal portion extending along the upper surface of the trench and a vertical portion extending along the upper sidewall of the trench.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to those of ordinary skill in the art, several exemplary embodiments will be detailed as follows, with reference to the accompanying drawings using numbered elements to elaborate the contents and effects to be achieved.

FIG. 1 to FIG. 6 are schematic cross-sectional views illustrate the steps of forming a semiconductor device according to a first embodiment of the present invention.

Figure 1:
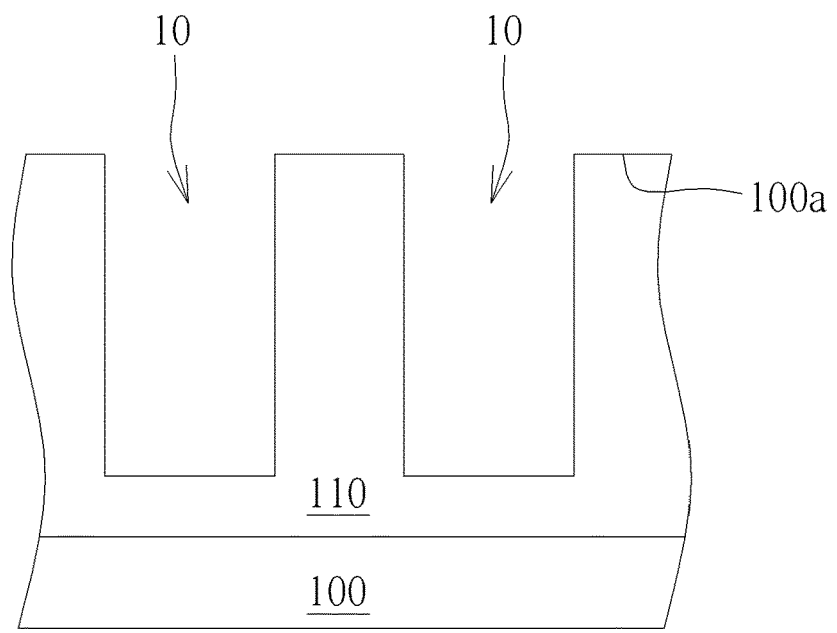
FIG. 1 to FIG. 6 are schematic cross-sectional views illustrate the steps of forming a semiconductor device according to a first embodiment of the present invention.

Please refer to FIG. 1. First, a substrate 100 is provided. The substrate 100 may be a silicon substrate or a silicon-on-insulator (SOI) substrate, but not limited hereto. An ion implantation process is performed to implant ions having a first conductivity type into the substrate 100 from the upper surface 100a of the substrate 100 thereby forming a well region 110 having the first conductivity type. For example, the ions implanted into the substrate 100 to form the well region 110 may include boron (B) ions having p-type conductivity. A patterning process is then performed to form at least a trench 10 in the substrate 100. The depth of the trench 10 is smaller than the depth of the well region 110. The trench 10 is completely encompassed within the well region 110. The patterning process to form the trench 10 may include forming a patterned mask (not shown), such as a patterned photoresist layer, on the substrate 100 and then using the patterned mask as an etching mask to etch the substrate 100 thereby forming the trench 10. In another embodiment, preferably, a hard mask layer (not shown) may be formed covering on the upper surface 100a of the substrate 100 and the patterned mask is formed on the hard mask layer (not shown). The pattern of the patterned mask is transferred to the underneath hard mask layer and then transferred to the substrate 100 using the hard mask layer as an etching mask to etch the substrate 100.

Figure 2:
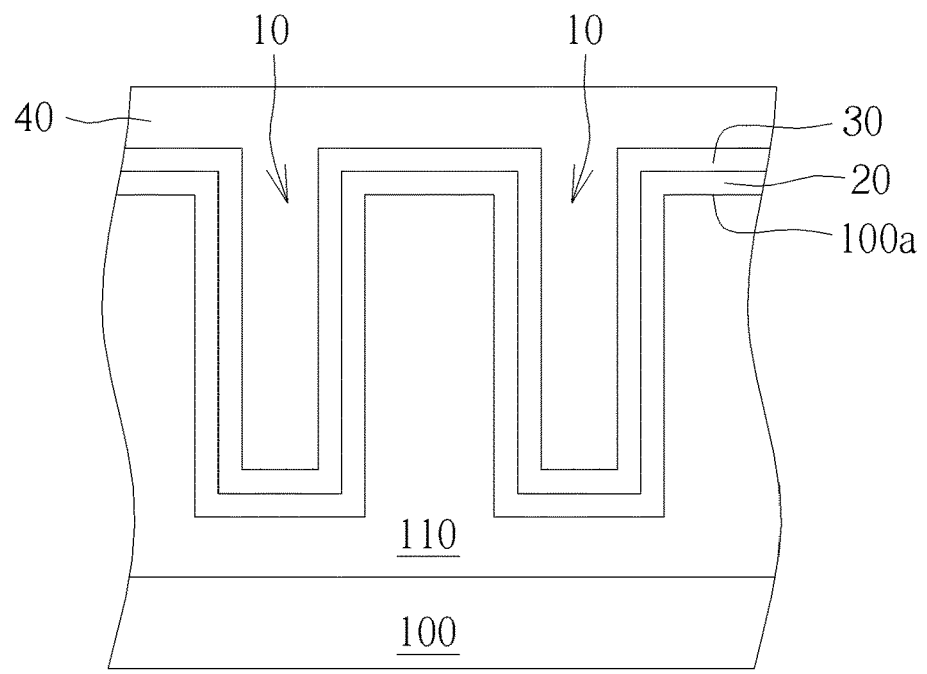

Please refer to FIG. 2. Next, a gate dielectric layer 20 and a barrier layer 30 are successively formed on the substrate 100 and conformally covering the upper surface 110a of the substrate 100, a bottom surface and a sidewall of the trench 10. A conductive material 40 is then formed on the substrate 100 and filling up the trench 10. The gate dielectric layer 20 may comprise dielectric materials. For example, the gate dielectric layer 20 may comprise silicon oxide formed by performing an atomic layer deposition (ALD) process or an in-situ steam generation (ISSG), but not limited hereto. The barrier layer 30 may have a single-layered structure or a multi-layered structure and may comprise titanium (Ti), tantalum (Ta), titanium nitride (TiN) or tantalum nitride (TaN) formed by performing an atomic layer deposition (ALD) or a chemical vapor deposition process, but not limited hereto.

Figure 3:
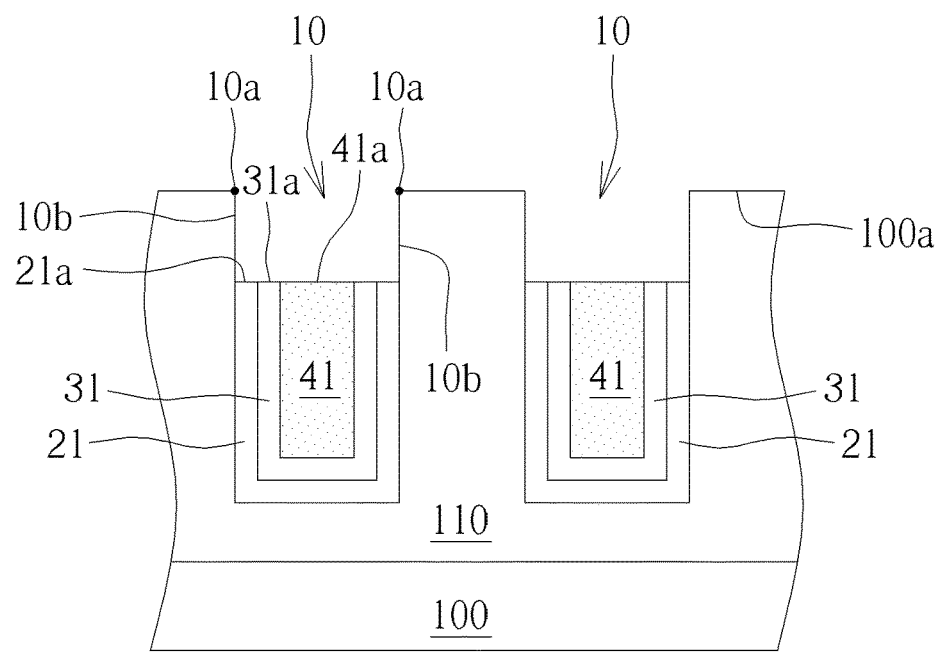

Please refer to FIG. 3. Subsequently, a chemical mechanical polishing (CMP) process or an etching back process is performed to remove the excess conductive material 40, barrier layer 30 and gate dielectric layer 20 outside the trench 10 until the upper surface 100a of the substrate 100 is exposed. After that, a portion of the conductive material 40 filling an upper portion of the trench 10 and a portion of the barrier layer 30 and the gate dielectric layer 20 covering an upper sidewall 10b of the trench 10 are removed to expose the top corner 10a and upper sidewall 10b of the trench 10. The remaining conductive material 41, barrier layer 31 and gate dielectric layer 21 fill a lower portion of the trench 10. A top surface 41a of the conductive material 41, a top surface 31a of the barrier layer and a top surface 21a of the gate dielectric layer 21 are substantially flush with each other and are all below the upper surface 100a of the substrate 100. In another embodiment, the gate dielectric layer 20 on the upper sidewall 10b of the trench 10 may be remained to be a protecting layer for the upper sidewall 10b in subsequent process.

Figure 4:
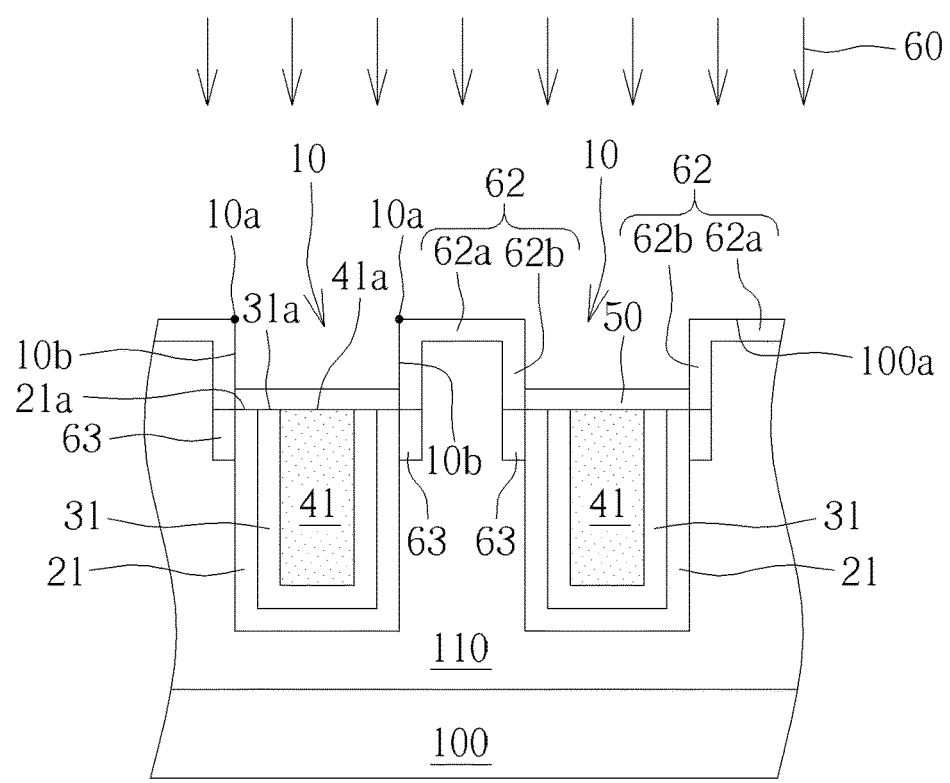

Please refer to FIG. 4. Optionally, an insulating layer 50 may be formed in the trench 10 to completely cover the conductive material 41, the barrier layer 31 and the gate dielectric layer 21. The insulating layer 50 may comprise silicon oxide or silicon nitride, but not limited hereto. After that, a doping process 60 is performed to implant ions having a second conductivity type complementary to the first conductivity type into a shallow region in the substrate 10 along the exposed upper surface 100a of the substrate 10 and the exposed upper sidewall 10b and top corner 10a of the trench 10, thereby forming a doped region 62 having an upside-down L shape. Preferably, the doping process 60 is a plasma doping (PLAD) process. According to an embodiment, the ions implanted into the substrate 100 to form the doped region 62 may include phosphorous (P) ions or arsenic (As) ions having n-type conductivity, but not limited hereto. As shown in FIG. 4, the doped region 62 is formed at the top corner 10a of the trench and has a horizontal portion 62a extending along the upper surface 100a of the substrate 100 and a vertical portion 62b extending along the upper sidewall 10b of the trench 10. A bottom surface of the horizontal portion 62a is above the top surface 31a of the barrier layer 31 and a bottom surface of the vertical portion 62b is flush with the top surface 31a of the barrier layer 31. Optionally, an annealing process may be performed after the doping process 60 to activate the implanted ions in the substrate 100. The anneal process may cause a portion of the ions in the vertical portion 62b of the doped region 62 diffusing to a deeper region in the substrate 100 thereby forming a diffusion area 63 below the top surface 31a of the barrier layer 31.

Figure 5:
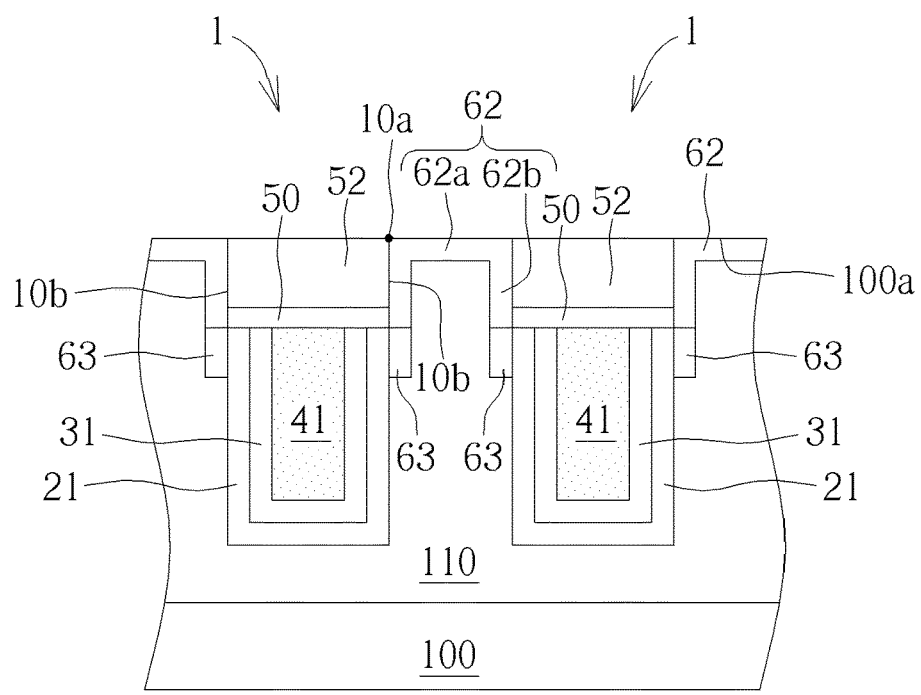

Please refer to FIG. 5. After forming the doped region 62, a cap layer 52 is formed to fill up the trench 10. The semiconductor device 1 according to the first embodiment is obtained. The cap layer 52 may comprise silicon oxide or silicon nitride, but not limited hereto. The semiconductor device 1 is a trench-type gate, for example, a trench-type gate of a DRAM device. The conductive material 41 filling in the trench 10 of the semiconductor device 1 is the gate electrode, and the region of the substrate 100 overlapped with the conductive material 41 along the bottom and side wall of the trench 10 is the channel region. The doped regions 62 formed at two sides of the opening of the trench 10 are the source/drain regions of the semiconductor device 1 and are in direct contact with the well region 110. As shown in FIG. 5, the two doped regions 62 between the trenches 10 of two neighboring semiconductor device 1 are connected by sharing the same horizontal portion 62a, thereby forming an upside-down U shaped doped region.

Figure 6:
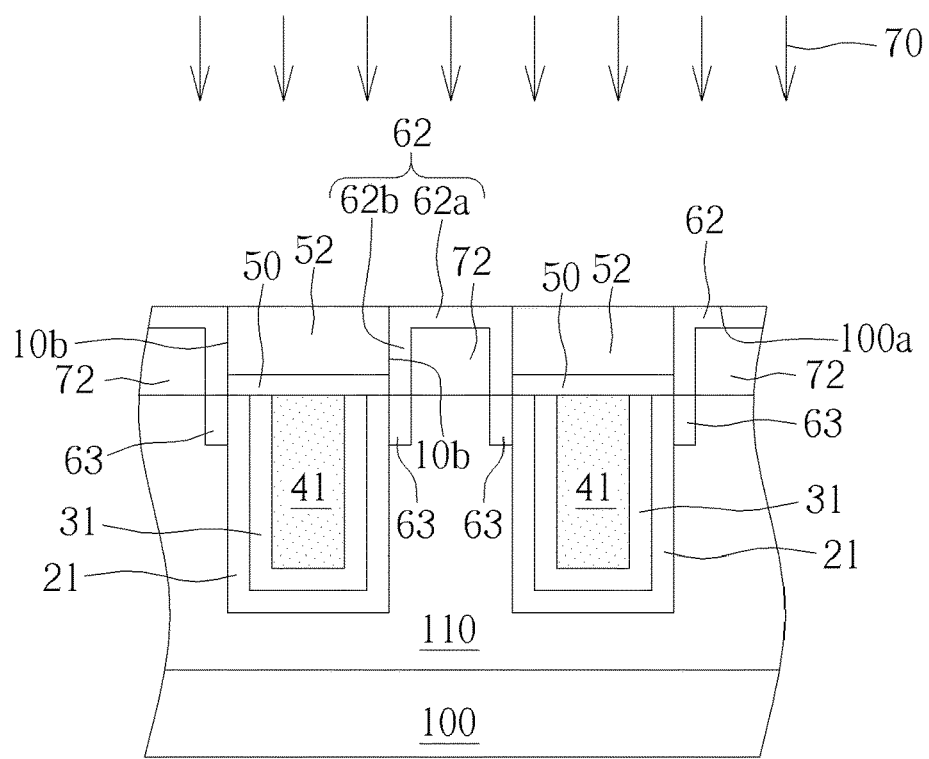

Please refer to FIG. 6. In another embodiment, the doped regions 62 at two sides of the opening of the trench 10 may be lightly doped drain (LDD) regions of the semiconductor device 1, and another doping process 70 may be performed after forming the cap layer 52 to implant more ions having the second conductivity type into the substrate 100 from the upper surface 100a to form source/drain regions 72 adjacent to the upper sidewall 10b of the trench 10. The doped region 62 as a LDD region may have ion concentration between 1% and 10% of the ion concentration of the source/drain regions 72. By controlling the implanting energy of the doping process 70, the source/drain regions 72 may have depth equal to or preferably smaller than the depth of the vertical portion 62b of the doped region 62. Therefore, the leakage current (GIDL) caused by overlapping between the source/drain regions 72 and the barrier layer 31 is reduced.

One feature of the present invention is that a doped region which may be a LDD region or a source/drain region of the trench-type gate is formed in a shallow depth from the upper surface of the substrate and the upper sidewall of the trench and having an up-side down L shape. Preferably, the doped region is formed by performing a plasma doping (PLAD) process. In comparison with conventional ion implantation process using ion beams, the present invention using plasma doping (PLAD) process to form the doped region may achieve better uniformity and also prevent ions from diffusing toward a deeper region in the substrate, thereby reducing the leakage current (GIDL) caused by the overlapping between the doped region and the gate electrode. Furthermore, since the up-side down L shaped doped region has a vertical portion extending along the upper sidewall of the trench to abut the channel region, when another ion implantation process is performed to form source/drain regions (as shown in FIG. 6) at two sides of the trench, the source/drain regions may be formed in a shallower depth from the upper surface of the substrate without concerning the need to abut the channel region. Therefore, ions for forming the source/drain regions may be implanted into the substrate using smaller implanting energy and the undesired diffusion of the ions may be avoided. The overlapping between the source/drain regions and the gate electrode is prevented.

FIG. 7 to FIG. 10 are schematic cross-sectional views illustrate the steps of forming a semiconductor device according to a second embodiment of the present invention.

Figure 7:
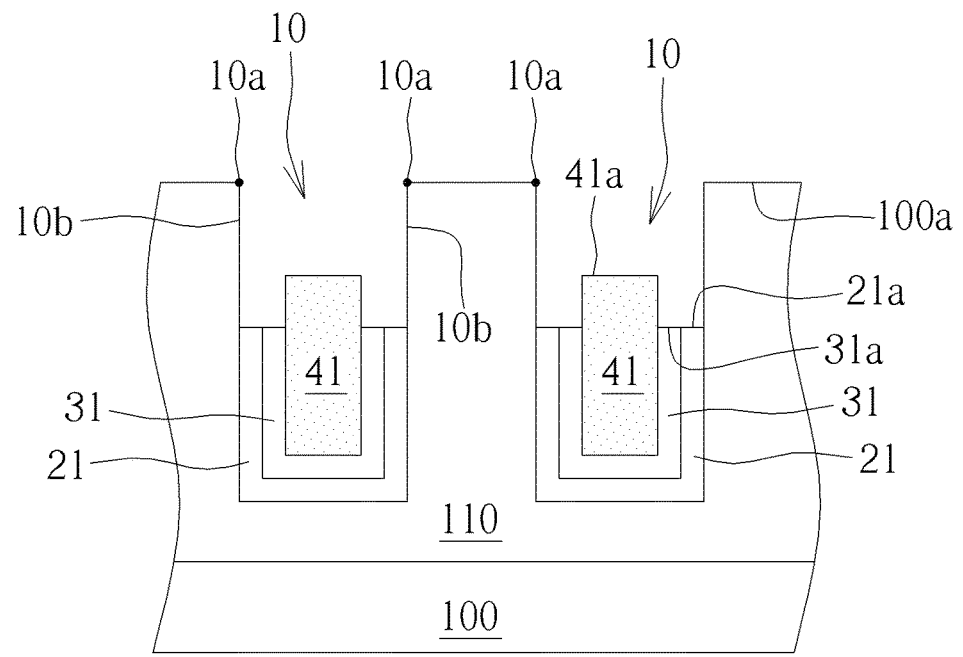
FIG. 7 to FIG. 10 are schematic cross-sectional views illustrate the steps of forming a semiconductor device according to a second embodiment of the present invention.

Please refer to FIG. 7. As illustrated in the previous embodiment, a substrate 100 is provided and at least a trench 10 is formed in the substrate 100. After that, a gate dielectric layer and a barrier layer are successively formed conformally covering the substrate 100 and the trench 10. A conductive material is then formed on the substrate 100 and filling up the trench 10. The excess conductive material, barrier layer and gate dielectric layer outside the trench 10 are removed until the upper surface 100a of the substrate 100 is exposed. A portion of the conductive material filling an upper portion of the trench 10 and a portion of the barrier layer and the gate dielectric layer covering an upper sidewall 10b of the trench 10 are then removed to expose the top corner 10a and the upper sidewall 10b of the trench 10. As shown in FIG. 7, a top surface 41a of the remaining conductive material 41, a top surface 31a of the remaining barrier layer 31 and a top surface 21a of the remaining gate dielectric layer 21 are all below the upper surface 100a of the substrate 100. The difference between the first embodiment and the second embodiment is that, in the second embodiment, the top surface 31a of the barrier layer 31 and the top surface 21a of the gate dielectric layer 21 are recessed to a level below the top surface 41a of the conductive material 41.

Figure 8:
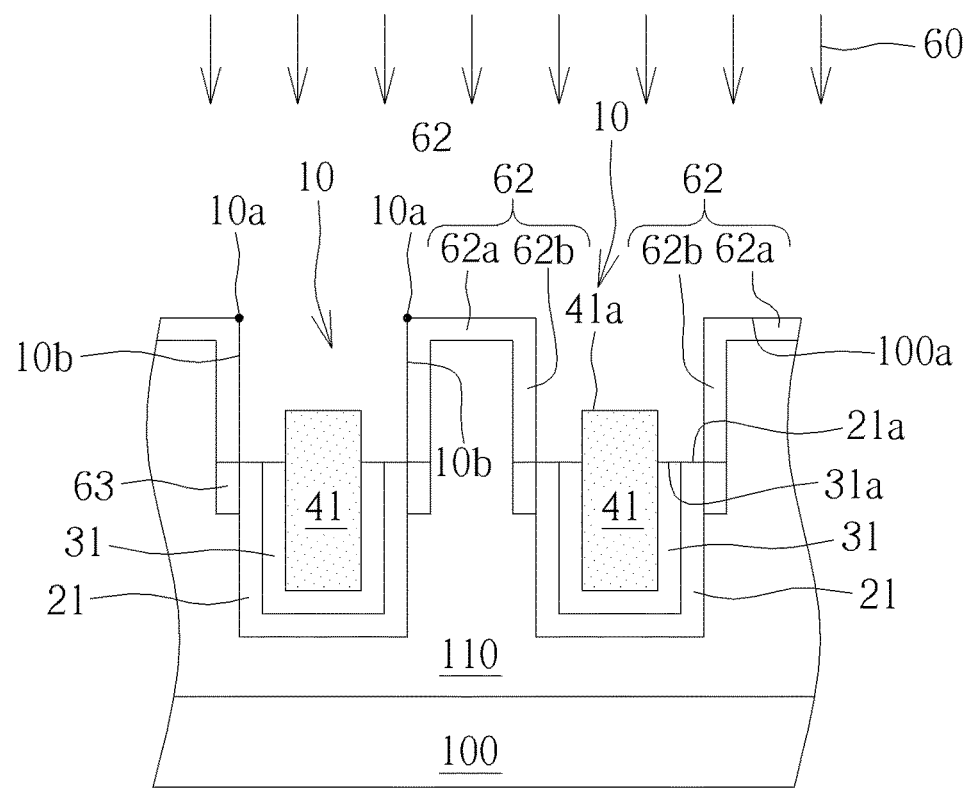

Please refer to FIG. 8. Subsequently, a doping process 60, preferably, a plasma doping (PLAD) process, is performed to implant ions having the second conductivity type into a shallow region in the substrate 10 along the exposed upper surface 100a of the substrate 10 and the exposed upper sidewall 10b and top corner 10a of the trench 10, thereby forming a doped region 62 having an upside-down L shape. The doped region 62 has a horizontal portion 62a extending along the upper surface 100a of the substrate 100 and a vertical portion 62b extending along the upper sidewall 10b of the trench 10. Preferably, the vertical portion 62b of the doped region 62 extends to be flush with the upper surface 31a of the barrier layer 31. An annealing process may be performed after the doping process 60 to activate the ions in the doped region 62. During the annealing process, a portion of the ions in the doped region 62 may diffuse downwardly along the sidewall of the trench 10 thereby forming a diffusion area 63 below the top surface 31a of the barrier layer 31. Optionally, an insulating layer (not shown) may be formed in the trench 10 and completely covering the conductive material 41, the barrier layer 31 and the gate dielectric layer 21 before performing the doping process 60.

Figure 9:
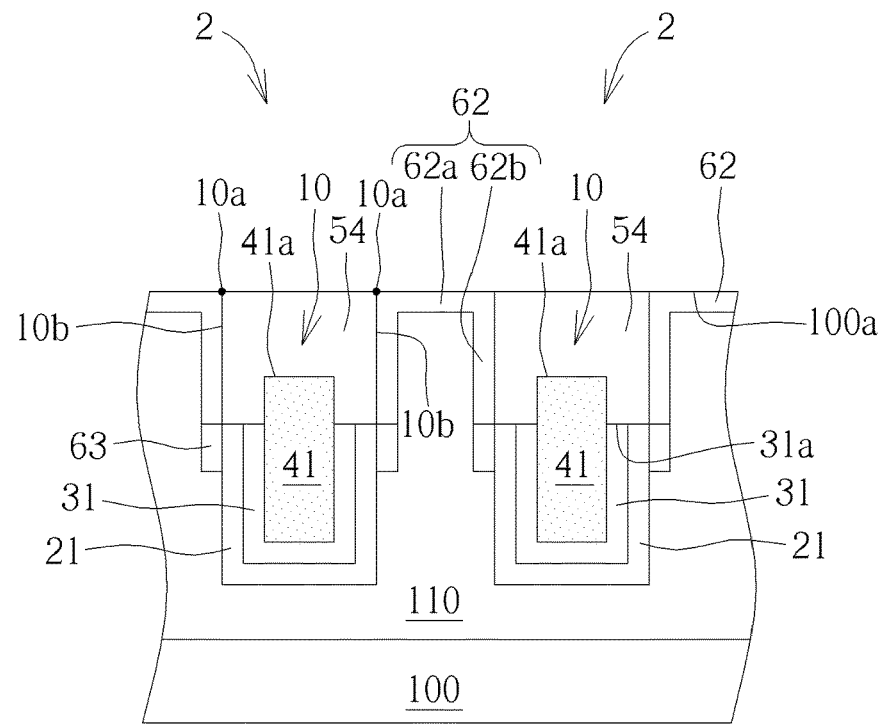
Figure 10:
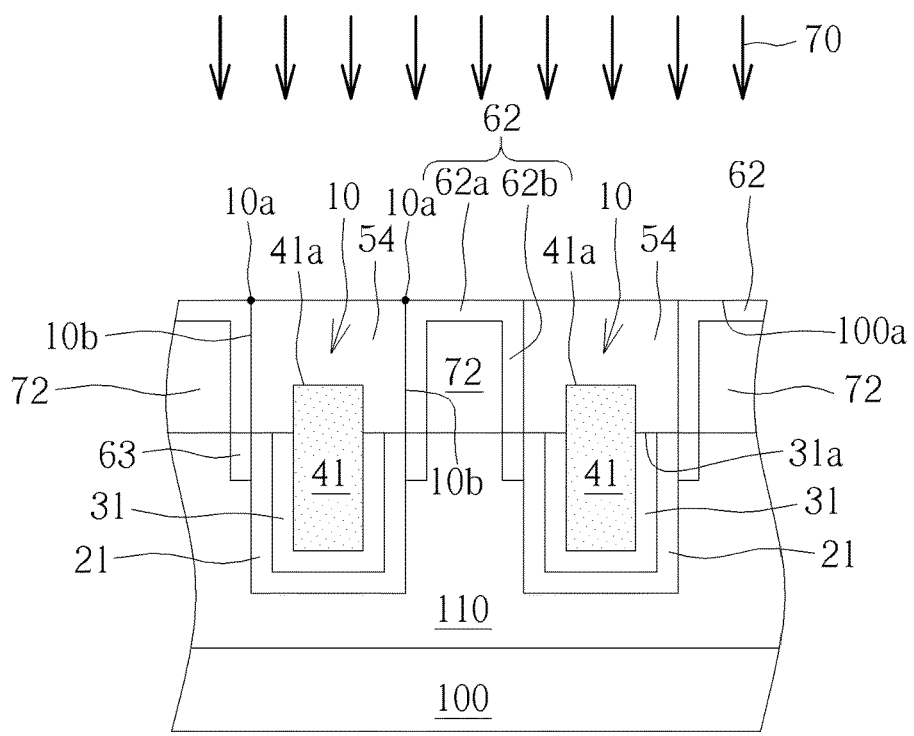

Please refer to FIG. 9. After that, a cap layer 54 is formed on the conductive material 41, the barrier layer 31 and the gate dielectric layer 21 and filling up the trench 10. The semiconductor device 2 according to the second embodiment is obtained. The cap layer 52 has an upside-down U. The cap layer 52 may comprise silicon oxide or silicon nitride, but not limited hereto. The semiconductor device 2 is a trench-type gate, for example, a trench-type gate of a DRAM device. The conductive material 41 filling in the trench 10 of the semiconductor device 2 is the gate electrode, and the region of the substrate 100 overlapped with the conductive material 41 along the bottom and side wall of the trench 10 is the channel region. The doped regions 62 formed at two sides of the opening of the trench 10 are the source/drain regions of the semiconductor device 2. Please refer to FIG. 10. In one embodiment where the doped region 62 is a lightly doped drain (LDD) region of the semiconductor device 2, after forming the cap layer 54, another doping process 70 may be performed to implant more ions having the second conductivity type into the substrate 100 to form the source/drain regions 72 adjacent to the upper sidewall 10b of the trench 10. The source/drain regions 72 may have a depth equal to or preferably smaller than the depth of the vertical portion 62b of the doped region 62. In the second embodiment, the barrier layer 31 and the gate dielectric layer 21 are recessed to be lower than the conductive material 41. The top surface 31a of the barrier layer 31 and the top surface 21a of the gate dielectric layer 21 are lower than the top surface 41a of the conductive material 41 and the leakage current (GIDL) resulting from overlapping between the source/drain region 72 and the barrier layer 31 may be better prevented.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for forming a semiconductor device, comprising:
    providing a substrate having an upper surface;
    forming a well region of a first conductivity type in the substrate;
    forming a trench in the substrate and completely in the well region;
    forming a conductive material filling the trench;
    removing a portion of the conductive material until a top surface of the conductive material is lower than the upper surface of the substrate thereby exposing the upper surface of the substrate and a top corner and an upper sidewall of the trench; and
    performing a doping process to form a doped region of a second conductivity type complementary to the first conductivity type in the well region and along the upper surface of the substrate and the top corner and the sidewall of the trench, wherein the doped region has an upside-down L shape.

2. The method for forming a semiconductor device according to claim 1, wherein the doping process is a plasma doping (PLAD) process.

3. The method for forming a semiconductor device according to claim 1, further comprising forming a barrier layer between the substrate and the conductive material.

4. The method for forming a semiconductor device according to claim 3, wherein the step of removing a portion of the conductive material comprises:
    removing a portion of the barrier layer until a top surface of the barrier layer is flush with the top surface of the conductive material.

5. The method for forming a semiconductor device according to claim 4, further comprising forming an insulating layer covering the top surface of the conductive material and the top surface of the barrier layer.

6. The method for forming a semiconductor device according to claim 3, wherein the step of removing a portion of the conductive material comprises:
    removing a portion of the barrier layer until a top surface of the barrier layer is lower than the top surface of the conductive material.

7. The method for forming a semiconductor device according to claim 3, further comprising forming a gate dielectric layer between the barrier layer and the substrate.

8. The method for forming a semiconductor device according to claim 1, further comprising forming a cap layer on the conductive material and filling up the trench after forming the doped region.

9. A semiconductor device, comprising:
    a substrate having an upper surface;

a well region of a first conductivity type formed in the substrate;

a trench formed in the substrate and completely in the well region;

a conductive material formed in the trench and having a top surface lower than the upper surface of the substrate and exposing a top corner and an upper sidewall of the trench; and a doped region having an upside-down L shape formed in the well region and at the top corner of the trench and having a horizontal portion extending along the upper surface of the substrate and a vertical portion extending along the upper sidewall of the trench, wherein the doped region has a second conductivity type complementary to the first conductivity type.

10. The semiconductor device according to claim 9, further comprising a barrier layer disposed between the substrate and the conductive material.

11. The semiconductor device according to claim 10, wherein a top surface of the barrier layer is flush with the top surface of the conductive material.

12. The semiconductor device according to claim 11, further comprising an insulating layer covering the top surface of the conductive material and the top surface of the barrier layer.

13. The semiconductor device according to claim 10, wherein a top surface of the barrier layer is lower than the top surface of the conductive material.

14. The semiconductor device according to claim 10, wherein the vertical portion of the doped region extends along the upper sidewall of the trench to be flush with a top corner of the barrier layer.

15. The semiconductor device according to claim 10, wherein a diffusion area below the vertical portion of the doped region is lower than a top surface of the barrier layer.

16. The semiconductor device according to claim 10, further comprising a gate dielectric layer disposed between the barrier layer and the substrate.

17. The semiconductor device according to claim 9, further comprising a cap layer disposed on the conductive material and filling up trench.

18. The semiconductor device according to claim 9, further comprising a source/drain region formed in the well region and adjacent to the upper sidewall of the trench, wherein the source/drain region has a depth equal to or smaller than a depth of the vertical portion of the doped region.

19. The semiconductor device according to claim 9, wherein the doped region is in direct contact with the well region.

20. The semiconductor device according to claim 9, wherein the doped regions of neighboring two of the semiconductor devices are connected thereby forming an upside-down U shaped doped region.

* * * * *